United States Patent
Mukai et al.

(10) Patent No.: US 6,873,226 B2
(45) Date of Patent: Mar. 29, 2005

(54) EDGE-REFLECTION SURFACE ACOUSTIC WAVE FILTER

(75) Inventors: Takao Mukai, Ishikawa-ken (JP); Michio Kadota, Kyoto (JP); Hideya Horiuchi, Nagaokakyo (JP); Mamoru Ikeura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 336 days.

(21) Appl. No.: 10/066,717

(22) Filed: Feb. 6, 2002

(65) Prior Publication Data

US 2002/0130736 A1 Sep. 19, 2002

(30) Foreign Application Priority Data

Mar. 19, 2001 (JP) .......................... 2001-078807

(51) Int. Cl.[7] .............. H03H 9/64; H03H 9/72
(52) U.S. Cl. .................. 333/133; 333/193; 333/196; 310/313 B
(58) Field of Search .................. 333/133, 193–196; 310/313 R, 313 B, 313 C, 313 D

(56) References Cited

U.S. PATENT DOCUMENTS

| | | | |
|---|---|---|---|
| 5,767,603 A | 6/1998 | Kadota et al. .......... 310/313 B |
| 5,790,000 A | 8/1998 | Dai et al. .................. 333/193 |
| 5,977,686 A | * 11/1999 | Kadota et al. .......... 310/313 B |
| 5,986,523 A | * 11/1999 | Morozumi et al. ......... 333/194 |
| 6,150,900 A | * 11/2000 | Kadota et al. ............. 333/133 |
| 6,297,712 B1 | * 10/2001 | Kadota et al. ............. 333/133 |
| 6,297,713 B1 | * 10/2001 | Kadota et al. ............. 333/133 |
| 6,346,864 B1 | * 2/2002 | Kadota ...................... 333/133 |
| 6,531,937 B2 | * 3/2003 | Kadota et al. ............. 333/193 |

FOREIGN PATENT DOCUMENTS

| | | |
|---|---|---|
| DE | 199 22 124 A1 | 12/1999 |
| JP | 51-011393 | 1/1976 |
| JP | 60-041809 | 3/1985 |
| JP | 7-245544 A | 9/1995 |
| JP | 8-279729 A | 10/1996 |
| JP | 2000-068782 A | 3/2000 |

* cited by examiner

*Primary Examiner*—Barbara Summons
(74) *Attorney, Agent, or Firm*—Keating & Bennett, LLP

(57) ABSTRACT

An edge reflection surface acoustic wave filter includes IDTs disposed on a top surface of a piezoelectric substrate, and surface acoustic waves of the Shear Horizontal type are reflected between opposite edges. At least one outermost electrode finger in the direction of propagation of surface acoustic waves on the side of at least one of the edges is removed. Accordingly, desired filter characteristics can readily be achieved without causing variations in filter characteristics, spurious components at frequencies lower than the passband are minimized, and selectivity is greatly improved.

33 Claims, 10 Drawing Sheets

EDGE-REFLECTION SURFACE ACOUSTIC WAVE FILTER

BACKGROUND OF THE INVENTION

1. Field of the Invention

The present invention relates to edge-reflection surface acoustic wave filters using surface acoustic waves of the SH (shear horizontal) type such as BGS (Bleustein-Gulyaev-Shimizu) waves and Love waves, and more specifically, the present invention relates to an edge-reflection surface acoustic wave filter in which the structure of electrode fingers near reflection edges of interdigital transducers (hereinafter abbreviated as IDTs) is significantly improved.

2. Description of the Related Art

Edge-reflection surface acoustic wave filters have been used, for example, in bandpass filters for communications apparatuses. FIG. 12 is a schematic plan view showing an example of an edge-reflection surface acoustic wave filter according to the related art. The edge-reflection surface acoustic wave filter 101 includes a rectangular plate-type piezoelectric substrate 102. The piezoelectric substrate 102 has a first edge 102a and a second edge 102b disposed opposite to each other. On a top surface of the piezoelectric substrate 102, IDTs 103 and 104 are provided. The IDTs 103 and 104 have a pair of comb electrodes 103a and 103b and a pair of comb electrodes 104a and 104b, respectively. The comb electrodes 103a, 103b, 104a, and 104b have a plurality of electrode fingers $103a_1$, a plurality of electrode fingers $103b_1$, a plurality of electrode fingers $104a_1$, and a plurality of electrode fingers $104b_1$, respectively. The electrode fingers $103a_1$ and the electrode fingers $103b_1$ are interdigitated with each other. Similarly, the electrode fingers $104a_1$ and the electrode fingers $104b_1$ are interdigitated with each other.

The electrode fingers $103a_1$ to $104b_1$ extend in a direction that is parallel to the edges 102a and 102b.

In the edge-reflection surface acoustic wave filter 101, when an input voltage is applied to the IDT 103, a surface acoustic wave of the SH type is excited and reflected at the edges 102a and 102b. The surface acoustic wave reflected between the edges 102a and 102b generates a standing wave, and the resonance characteristics associated with the standing wave appear in the output from the IDT 104.

In the edge-reflection surface acoustic wave filter 101, of the electrode fingers $103a_1$ to $104b_1$, electrode fingers $103b_{1x}$ and $104a_{1x}$ that are located at an outermost position in the direction of propagation of surface acoustic waves (refer to FIG. 12) are arranged such that the outer edges thereof are aligned along the edges 102a and 102b. This is because the electrode fingers $103b_{1x}$ and $104a_{1x}$ are formed by cutting a mother piezoelectric substrate to form the edges 102a and 102b after a plurality of IDTs has been formed on the mother piezoelectric substrate.

However, the electrode fingers 103b, and 104a, adjacent to the reflection edges 102a and 102b are susceptible to damage in the cutting process, inevitably causing variation in filter characteristics.

With regard to the type of edge-reflection surface acoustic wave resonator using only one IDT, a method of reducing variation in characteristics due to damage to electrode fingers adjacent to reflection edges has been proposed. More specifically, Japanese Unexamined Patent Application Publication No. 60-41809 discloses a method of forming reflection edges at positions that are spaced by a distance that is equal to an integer multiple of λ/2 (λ is the wavelength of surface acoustic wave) from the centers of the outermost electrode fingers in the direction of propagation of surface acoustic waves. According to the disclosure, because the reflection edges are located at positions that are spaced by a distance that is equal to an integer multiple of λ/2 from the centers of the outermost electrode fingers in the direction of propagation of surface acoustic waves, the electrode fingers are not susceptible to damage in the cutting process for forming the reflection edges, whereby variations in resonance characteristics are reduced.

The method according to the related art reduces variations in resonance characteristics of an edge-reflection surface acoustic wave resonator. However, when the method is applied to an edge-reflection surface acoustic 14 wave filter, because the positions of the reflection edges are altered, filter characteristics become approximate to those in a case where the number of electrode fingers of IDT is increased. For example, if two IDTs having ten pairs of electrode fingers are disposed at an IDT interval of 1λ, the distance between the centers of the outermost electrode fingers on both sides is 21 λ. If reflection edges are disposed at a distance of 2×λ/2 (x/2 multiplied by an integer n, now assuming n=2) from the centers of the outermost electrode fingers of the IDTs, the distance between the reflection edges is 23λ. The filter characteristics in this case are approximate to those in a case where two IDTs having eleven pairs of electrode fingers are disposed at an IDT interval of 1k and reflection edges are disposed at the centers of the outermost electrode fingers. As a result, the bandwidth is reduced and the desired filter characteristics are not achieved.

SUMMARY OF THE INVENTION

In order to overcome the problems described above, preferred embodiments of the present invention provide an edge-reflection surface acoustic wave filter which eliminates variations in characteristics which are caused by damage to electrode fingers, while still achieving desired filter characteristics.

According to a preferred embodiment of the present invention, an edge-reflection surface acoustic wave filter using SH type surface acoustic waves includes a piezoelectric substrate having a first edge and a second edge disposed opposite to each other, the first and second edges defining reflection edges, and at least two interdigital transducers including electrode fingers and being disposed on the piezoelectric substrate, wherein at least one outermost electrode finger in the direction of propagation of surface acoustic waves on the side of at least one of the reflection edges is removed.

As a result of this unique structure and arrangement of elements, desired filter characteristics are achieved without causing variations in filter characteristics or altering bandwidth, or other undesirable results. Furthermore, spurious components at frequencies lower than the passband are minimized.

According to another preferred embodiment of the present invention, an edge-reflection surface acoustic wave filter using SH-type surface acoustic waves includes a piezoelectric substrate having a first edge and a second edge disposed opposite to each other, the first and second edges defining reflection edges, and at least two interdigital transducers including electrode fingers and disposed on the piezoelectric substrate, wherein at least one outermost electrode finger in the direction of propagation of surface acoustic waves on the side of at least one of the reflection edges is constructed as a floating electrode finger so as not to be electrically connected to any of the other electrode fingers.

As a result of this unique structure and arrangement of elements, desired filter characteristics are achieved without causing variations in filter characteristics or altering bandwidth, or other undesirable results. Furthermore, spurious components at frequencies lower than the passband are minimized.

According to another preferred embodiment of the present invention, an edge-reflection surface acoustic wave filter using SH-type surface acoustic waves includes a piezoelectric substrate having a first edge and a second edge disposed opposite to each other, the first and second edges defining reflection edges, and at least two interdigital transducers including electrode fingers and disposed on the piezoelectric substrate, wherein withdrawal is performed so that at least one outermost electrode finger in the direction of propagation of surface acoustic waves on the side of at least one of the reflection edges is connected to the same potential as an adjacent electrode finger.

As a result of this unique structure and arrangement of elements, desired filter characteristics are achieved without causing variations in filter characteristics or altering-bandwidth, or other undesirable results. Furthermore, spurious components at frequencies lower than the passband are minimized.

According to another preferred embodiment of the present invention, an edge-reflection surface acoustic wave filter using SH-type surface acoustic waves includes a piezoelectric substrate having a first edge and a second edge disposed opposite to each other, the first and second edges defining reflection edges, and at least two interdigital transducers including electrode fingers and disposed on the piezoelectric substrate, wherein the width of at least one outermost electrode finger in the direction of propagation of surface acoustic waves on the side of at least one of the reflection edges is such that the distance between the outermost electrode finger and an adjacent electrode finger is less than the distance between other electrode fingers in the interdigital transducer to which the outermost electrode finger belongs.

As a result of this unique structure and arrangement of elements, desired filter characteristics are achieved. Furthermore, because the outermost electrode finger is made wider, the electrode finger becomes unsusceptible to damage which may occur during the cutting process for forming the edges, thereby minimizing variations in filter characteristics.

The electrode fingers of the at least two interdigital transducers may be split electrodes. Split electrodes refer to IDT electrode fingers split into a plurality of electrode finger segments connected to the same potential.

Accordingly, desired filter characteristics can be achieved without causing variations in filter characteristics. Furthermore, spurious components at frequencies lower than the passband are minimized.

The type of the edge-reflection surface acoustic wave filters according to the present invention are not specifically limited, and may be, for example, a longitudinally coupled resonator filter, a transversally coupled resonator filter, or a ladder filter.

Accordingly, desired filter characteristics can readily be achieved while also eliminating variations in filter characteristics. Furthermore, spurious components at frequencies lower than the passband are minimized effectively.

According to another preferred embodiment of the present invention, a duplexer includes at least one edge-reflection surface acoustic wave filter according to any of the various preferred embodiments of the present invention as described above.

According to another preferred embodiment of the present invention, a communication apparatus includes a duplexer according to the preferred embodiment of the present invention as described above.

Accordingly, variations in characteristics are eliminated, desired band characteristics can readily be achieved, and selectivity is greatly improved.

Other features, characteristics, characteristics and advantages of the present invention will become more apparent from the following detailed description of preferred embodiments thereof with reference to the attached drawings.

DETAILED DESCRIPTION OF PREFERRED EMBODIMENTS

Edge-reflection surface acoustic wave filters according to preferred embodiments of the present invention will now be described with reference to the accompanying drawings.

Figure 1:
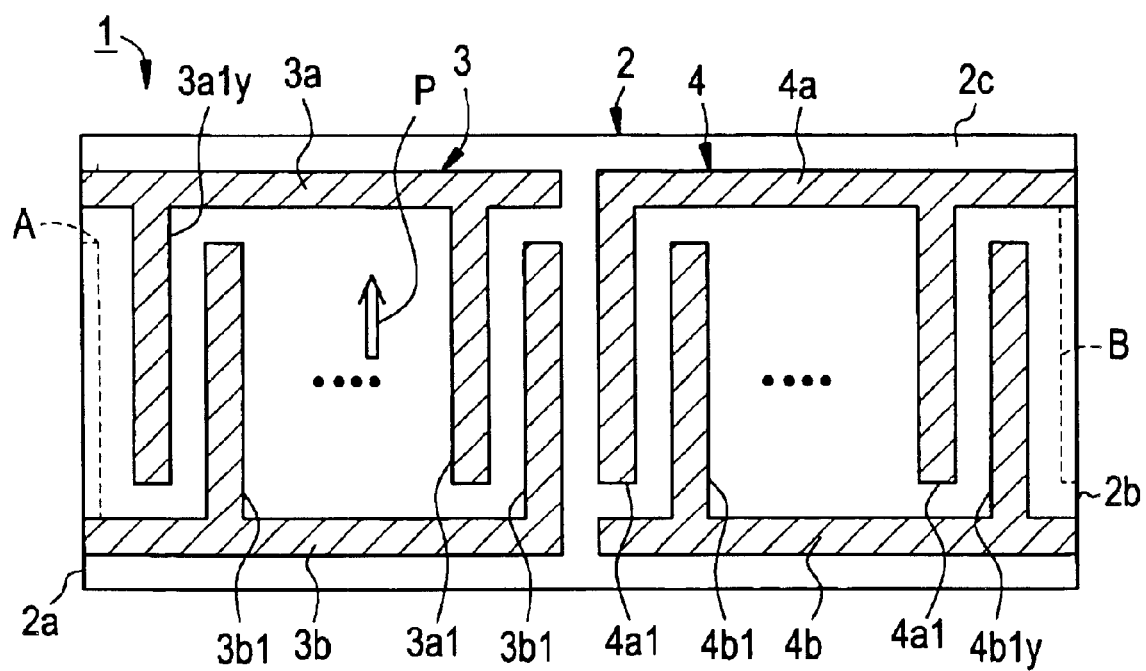
FIG. 1 is a plan view of an edge-reflection surface acoustic wave filter according to a first preferred embodiment of the present invention.

FIG. 1 is a plan view of an edge-reflection surface acoustic wave filter according to a first preferred embodiment of the present invention. The edge-reflection surface acoustic wave filter 1 is preferably a longitudinally coupled resonator filter.

The edge-reflection surface acoustic wave filter 1 includes a substantially rectangular plate piezoelectric substrate 2. The piezoelectric substrate 2 is polarized along the direction labeled as P. The piezoelectric substrate 2 may be made of various materials, including a piezoelectric single crystal of $LiTaO_3$, $LiNbO_3$, or other suitable material, and piezoelectric ceramic materials such as lead zirconate titanate ceramic materials, or other suitable materials.

Alternatively, the piezoelectric substrate 2 may be formed by disposing a piezoelectric thin film such as a ZnO thin film on an insulating substrate made of an insulating material such as alumina, for example.

The piezoelectric substrate 2 has a first edge 2a and a second edge 2b disposed opposite to each other. On a top surface 2c of the piezoelectric substrate 2, a first IDT 3 and a second IDT 4 are disposed. The IDTs 3 and 4 have a pair of comb electrodes 3a and 3b and a pair of comb electrodes 4a and 4b, respectively.

The comb electrode 3a has a plurality of electrode fingers $3a_1$. Similarly, the comb electrodes 3b, 4a, and 4b have a plurality of electrode fingers $3b_1$, a plurality of electrode fingers $4a_1$, and a plurality of electrode fingers $4b_1$, respectively.

The electrode fingers $3a_1$ of the comb electrode 3a and the electrode fingers $3b_1$ of the comb electrode 3b are interdigitated with each other. Similarly, the electrode fingers $4a_1$ of the comb electrode 4a and the electrode fingers $4b_1$ of the comb electrode 4b are interdigitated with each other.

The electrode fingers $3a_1$ to $4b_1$ extend in a direction that is substantially parallel to the edges 2a and 2b.

Figure 12:
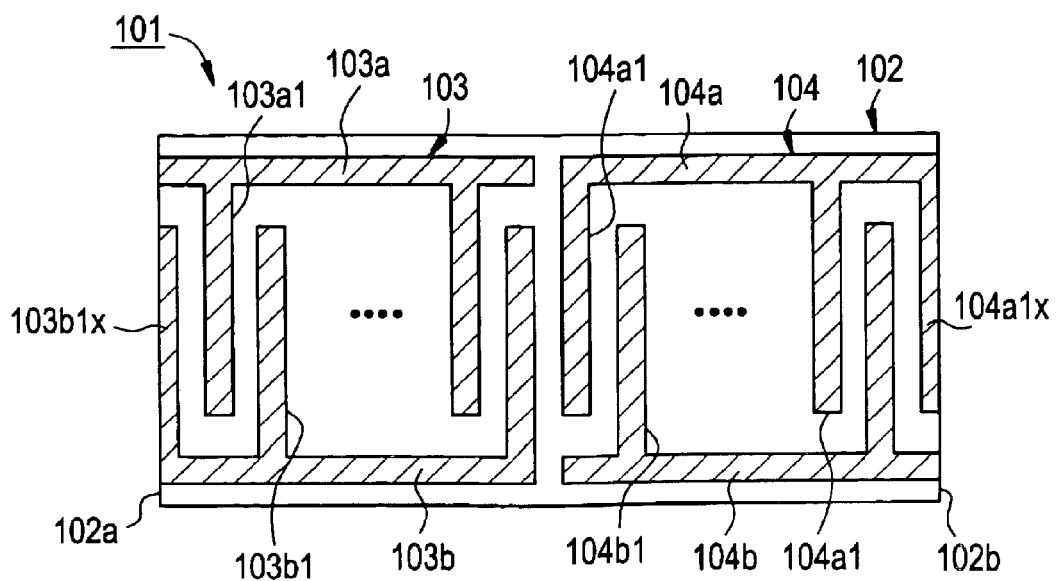
FIG. 12 is a plan view showing an example of edge-reflection surface acoustic wave filter according to the related art.

The edge-reflection surface acoustic wave filter 1 according to this preferred embodiment is characterized in that the outermost electrode finger in the direction of propagation of surface acoustic waves is removed in each of the IDTs 3 and 4. More specifically, as shown in FIG. 12, in the edge-reflection surface acoustic wave filter 101 according to the related art, the outermost electrode fingers $103b_{1x}$ and $104a_{1x}$ in the direction of propagation of surface acoustic waves are disposed along the edges 102a and 102b. In contrast, in this preferred embodiment, as shown by dashed lines A and B in FIG. 1, the outermost electrode finger in each of the IDTs 3 and 4 in the direction of propagation of surface acoustic waves is removed. That is, in the IDTs 3 and 4, a plurality of electrode fingers are disposed at an interval of approximately λ/4 along the direction of propagation of surface acoustic waves, with the outermost electrode finger in the direction of propagation of surface acoustic waves on the side of each of the edges 2a and 2b, i.e., electrode fingers which are supposed to be located along the edges 2a and 2b, are removed.

In the edge-reflection surface acoustic wave filter 1, the outermost electrode fingers in the direction of propagation of surface acoustic waves, indicated by the dashed lines A and B, are removed. Thus, when the edges 2a and 2b are formed by cutting a mother piezoelectric substrate in the thickness direction after the IDTs 3 and 4 have been formed on the mother piezoelectric substrate, damage to the electrode fingers is substantially prevented, thereby minimizing variations in filter characteristics.

Furthermore, because the positions of the edges 2a and 2b are the same as in a case where the outermost electrode fingers are disposed at the positions indicated by the dashed lines A and B, desired filter bandwidth can readily be achieved.

More specifically, the edges 2a and 2b are located at approximately λ/2 from the centers of electrode fingers $3a_{1y}$ and $4b_{1y}$, respectively, which are disposed outermost in the direction of propagation of surface acoustic waves among the electrode fingers that are actually formed on the substrate. The positions of the edges 2a and 2b coincide with the outer edges of the removed electrode fingers indicated by the dashed lines A and B, respectively. More specifically, because the width of the electrode fingers disposed at the positions indicated by the dashed lines A and B is usually about λ/8, the edges 2a and 2b are disposed along the outer edges of the removed electrode fingers indicated by the dashed lines A and B, respectively.

Next, an actual experiment will be described.

Figure 2:
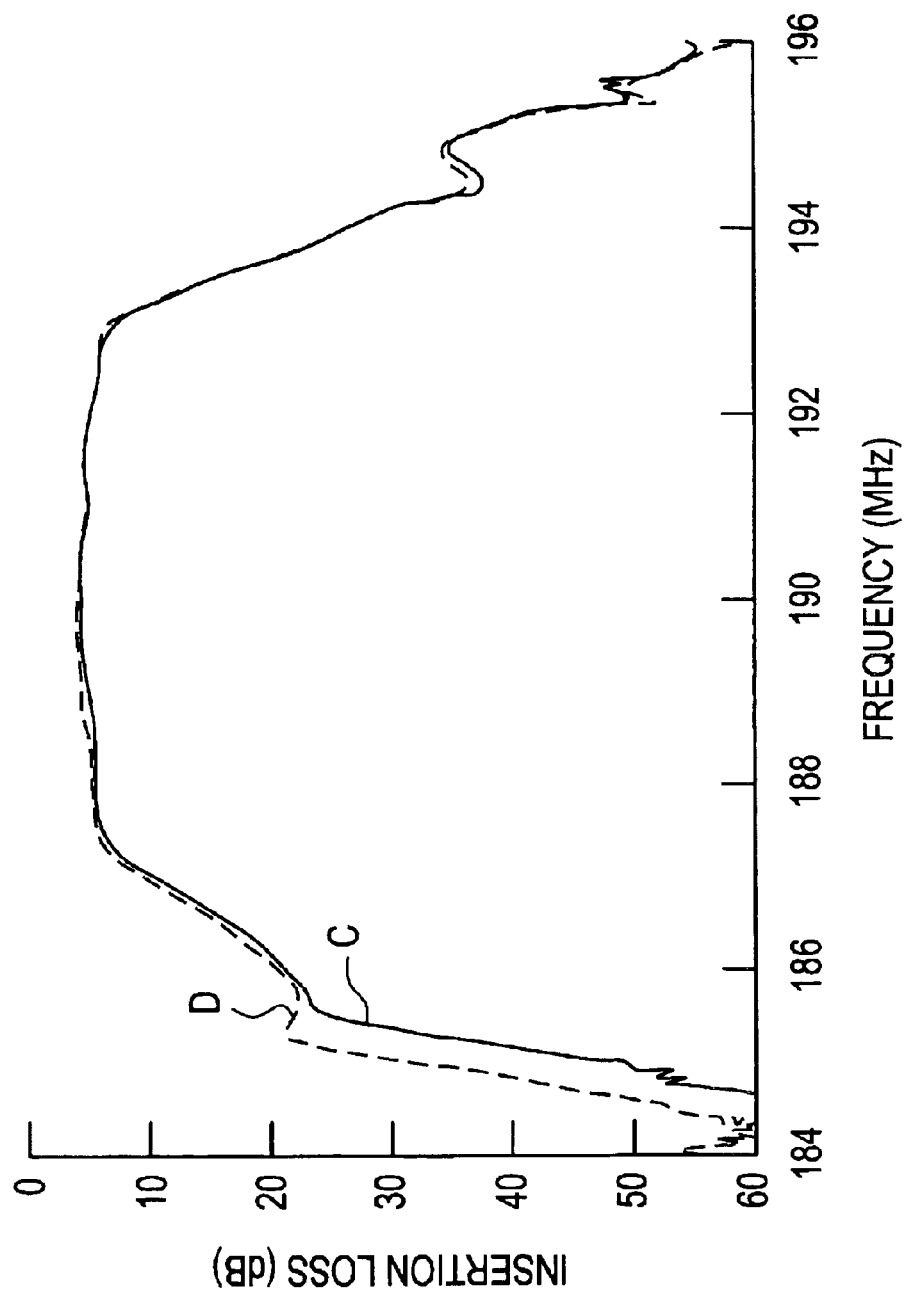
FIG. 2 is a graph showing the frequency characteristics of the edge-reflection surface acoustic wave filter according to the first preferred embodiment and an edge-reflection surface acoustic wave filter according to a related art prepared for the purpose of comparison.

FIG. 2 is a graph showing the frequency characteristics of the edge-reflection surface acoustic wave filter according to the first preferred embodiment and an edge-reflection surface acoustic wave filter according to the related art prepared for the purpose of comparison to the present invention. The edge-reflection surface acoustic wave filter 1 according to the present preferred embodiment was implemented by using a piezoelectric substrate 2 having the dimensions of approximately 1.4×2.0×0.35 (thickness) mm and made of $LiTaO_3$, and forming IDTs 3 and 4 on the piezoelectric substrate 2. The number of pairs of electrode fingers of the IDT3 was 20, and the number of pairs of electrode fingers of the IDT4 was 14, i.e., the total number of pairs of electrode fingers was 34. The overlap width of the electrode fingers was about 0.4 mm, and the width of the electrode fingers was about 0.005 mm.

The edge-reflection surface acoustic wave filter prepared for the purpose of comparison was constructed in the same manner as the above-described preferred embodiment of the present invention except that electrode fingers having a width of λ/8 were formed at an outermost position in the direction of propagation of surface acoustic waves along the reflection edges, i.e., the construction of the edge-reflection surface acoustic wave filter was as shown in FIG. 12.

In FIG. 2, a solid line C represents the frequency characteristics in the preferred embodiment described above, and a dashed line D represents the frequency characteristics in the related art.

As is apparent from FIG. 2, because the positions of the reflection edges were the same as in the related art, reduction in the bandwidth was extremely small. Furthermore, because the outermost electrode fingers were removed in the present preferred embodiment of the present invention, spurious components at frequencies lower than the passband, more specifically, in the vicinity of about 185.2 MHz, were attenuated, thus significantly improving selectivity.

Figure 3:
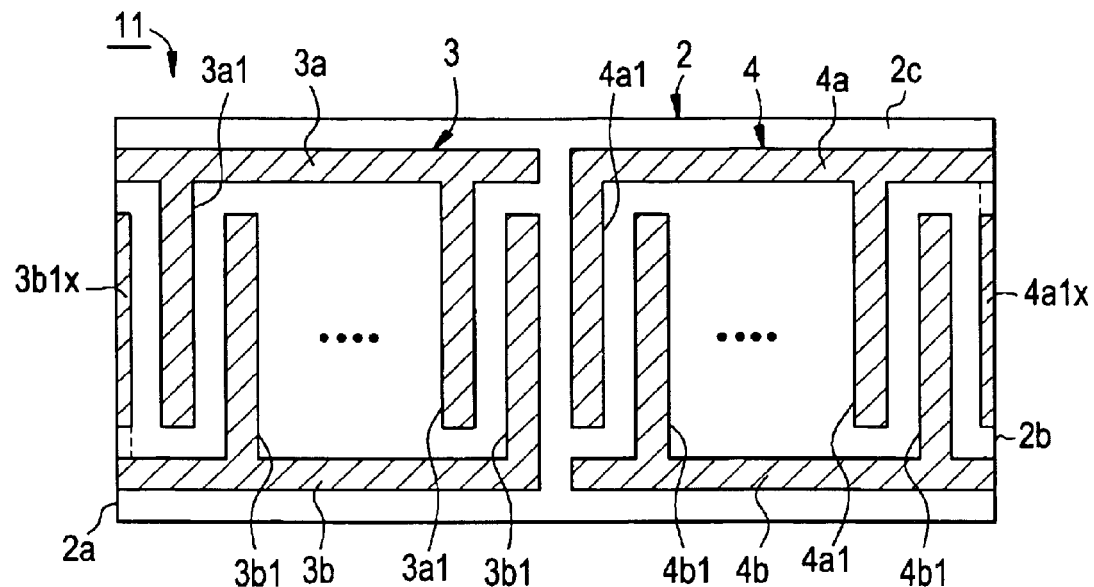
FIG. 3 is a plan view of an edge-reflection surface acoustic wave filter according to a second preferred embodiment of the present invention.

FIG. 3 is a plan view of an edge-reflection surface acoustic wave filter according to a second preferred embodiment of the present invention. The construction of the edge-reflection surface acoustic wave filter 11 is preferably substantially the same as that of the edge-reflection surface acoustic wave filter 1 according to the first preferred embodiment except for the structure of outermost electrode fingers in the direction of propagation of surface acoustic waves. Thus, the same elements are designated by the same reference characters, and the description of the first preferred embodiment applies for details thereof.

In the edge-reflection surface acoustic wave filter 11, the outermost electrode fingers $3b_{1x}$ and $4a_{1x}$ of the IDTs 3 and 4 are electrically connected to none of the other electrode fingers $3a_1$ to $4b_1$. That is, the electrode fingers $3b_{1x}$ and $4a_{1x}$ are constructed as floating electrode fingers. The width of the electrode fingers $3b_{1x}$ and $4a_{1x}$ is preferably about λ/8.

According to the second preferred embodiment, in which the outermost electrode finger in the direction of propagation of surface acoustic waves on the side of each of the edges $2a$ and $2b$ is constructed as a floating electrode finger, similarly to the first preferred embodiment, desired filter characteristics can be achieved without causing variation in the filter characteristics. More specifically, because the outermost electrode fingers $3b_{1x}$ and $4a_{1x}$ in the direction of propagation of surface acoustic waves are constructed as floating electrode fingers, even if the electrode finger $3b_{1x}$ or the electrode finger $4a_{1x}$ is chipped when a mother piezoelectric substrate is cut to form the edges $2a$ and $2b$, the filter characteristics are not significantly affected. Thus, variations in the filter characteristics are minimized.

Furthermore, because the positions of the edges $2a$ and $2b$ are the same as in the edge-reflection surface acoustic wave filter 101 according to the related art shown in FIG. 12, similarly to the first preferred embodiment, the bandwidth remains substantially the same as the filter characteristics of the edge-reflection surface acoustic wave filter 101.

Figure 7:
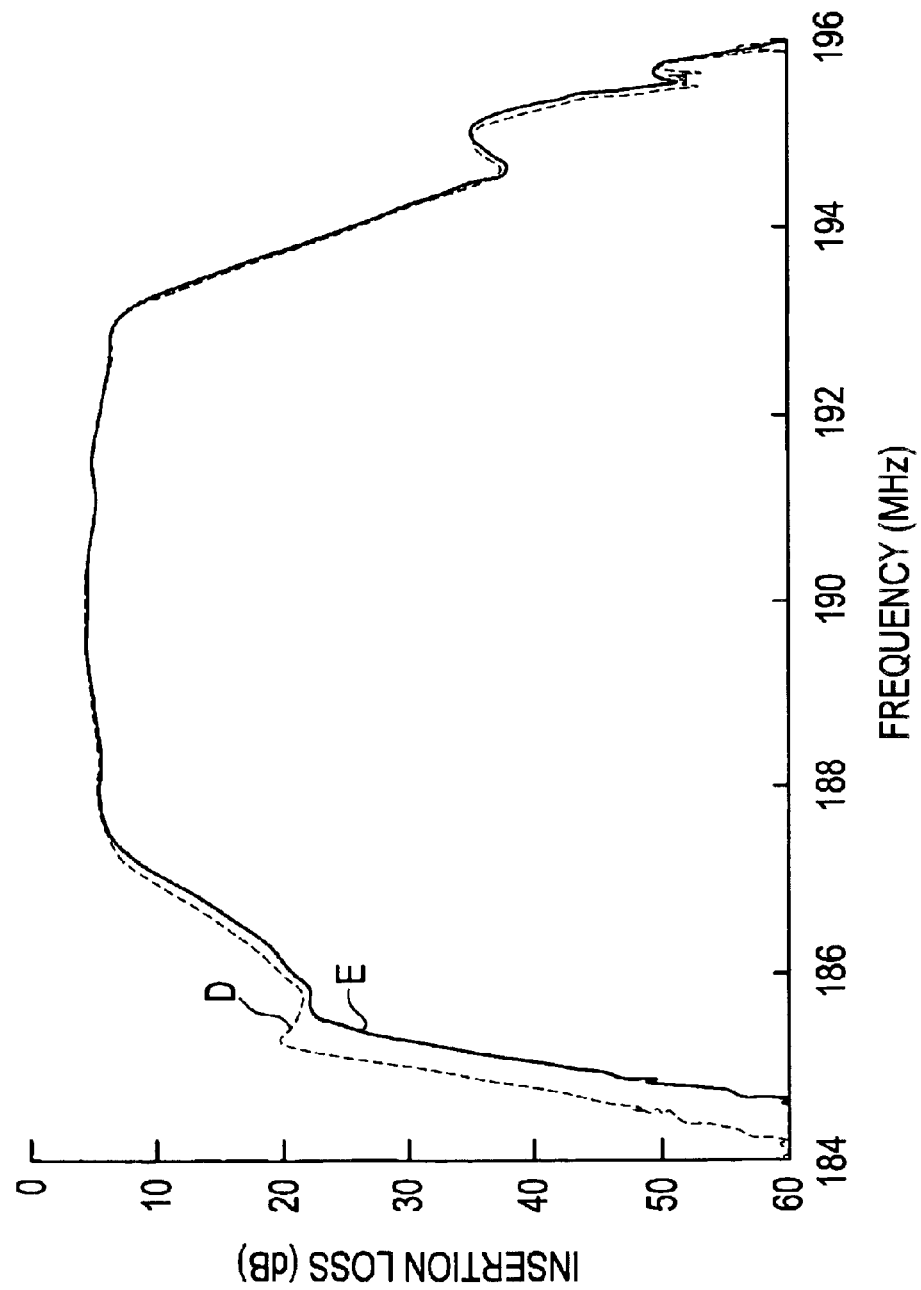
FIG. 7 is a graph showing the frequency characteristics of the edge-reflection surface acoustic wave filter according to the second preferred embodiment and the edge-reflection surface acoustic wave filter according to the related art.

In FIG. 7, a solid line E represents the frequency characteristics of the edge-reflection surface acoustic wave filter 11 according to the second preferred embodiment, which differs from the edge-reflection surface acoustic wave filter according to the related art provided for comparison with the first preferred embodiment only in that the outermost electrode fingers $3b_{1x}$ and $4a_{1x}$ in the direction of propagation of surface acoustic waves are constructed as floating electrode fingers.

In FIG. 7, for the purpose of comparison, the frequency characteristics of the edge-reflection surface acoustic wave filter according to the related art is shown by a dashed line D.

Figure 4:
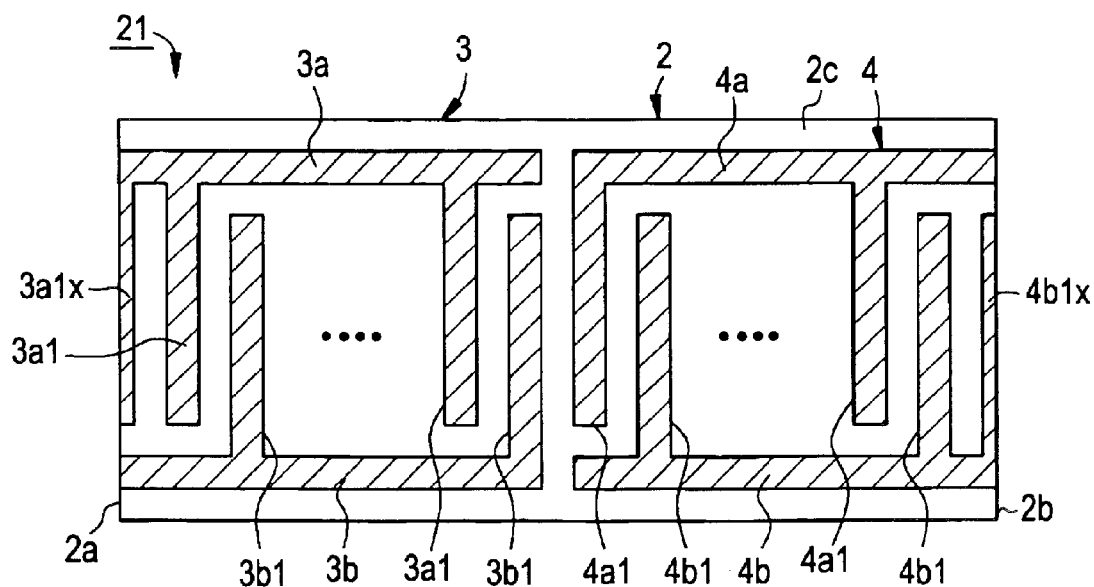
FIG. 4 is a plan view of an edge-reflection surface acoustic wave filter according to a third preferred embodiment of the present invention.

FIG. 4 is a plan view of an edge-reflection surface acoustic wave according to a third preferred embodiment of the present invention. The construction of the edge-reflection surface acoustic wave filter 21 is preferably substantially the same as the first preferred embodiment except in that a process called "withdrawal" is performed so that the outermost electrode fingers $3a_{1x}$ and $4b_{1x}$ in the direction of propagation of surface acoustic waves are connected to the same potential as the adjacent electrode fingers on the sides of the edges $2a$ and $2b$, respectively. Thus, the same elements are designated by the same reference characters as in the description of the first preferred embodiment, and the description of the first preferred embodiment applies to those elements.

In the edge-reflection surface acoustic wave filter 21, on the side of the edge $2a$, the outermost electrode finger $3a_{1x}$ in the direction of propagation of surface acoustic waves preferably has a width of about $\lambda/8$, and is disposed along the edge $2a$. However, the electrode finger $3a_{1x}$ is located on the side of the comb electrode $3a$ and connected to the same potential as an adjacent electrode finger $3a_{1x'}$. That is, as opposed to an ordinary IDT in which electrode fingers connected to one of the comb electrodes and electrode fingers connected to the other comb electrode are disposed alternately in the direction of propagation of surface acoustic waves, in this preferred embodiment, on the side of the edge $2a$, two electrode fingers connected to the same potential are disposed adjacent to each other. The method, in which a region is partially provided where two adjacent electrode fingers are connected to the same potential, has been known as "withdrawal" weighting of IDT. In this preferred embodiment, on the side of each of the edges $2a$ and $2b$, two outermost fingers in the direction of propagation of surface acoustic waves are connected to the same potential.

When at least one outermost electrode finger in the direction of propagation of surface acoustic waves is connected to the same potential as an adjacent electrode finger as in the third preferred embodiment, even when a mother piezoelectric substrate is cut to form edges $2a$ and $2b$, variation in filter characteristics is prevented from occurring. More specifically, because the electrode fingers $3a_{1x}$ and $4b_{1x}$ are connected to the same potential as adjacent electrodes, variation in filter characteristics does not occur even if the outermost electrode finger $3a_{1x}$ and $4b_{1x}$ are partially chipped.

In this preferred embodiment as well, similarly to the first preferred embodiment, the positions of the edges $2a$ and $2b$ are determined in accordance with desired filter characteristics, and therefore, variation in filter characteristics such as bandwidth remain substantially unaltered.

Figure 13:
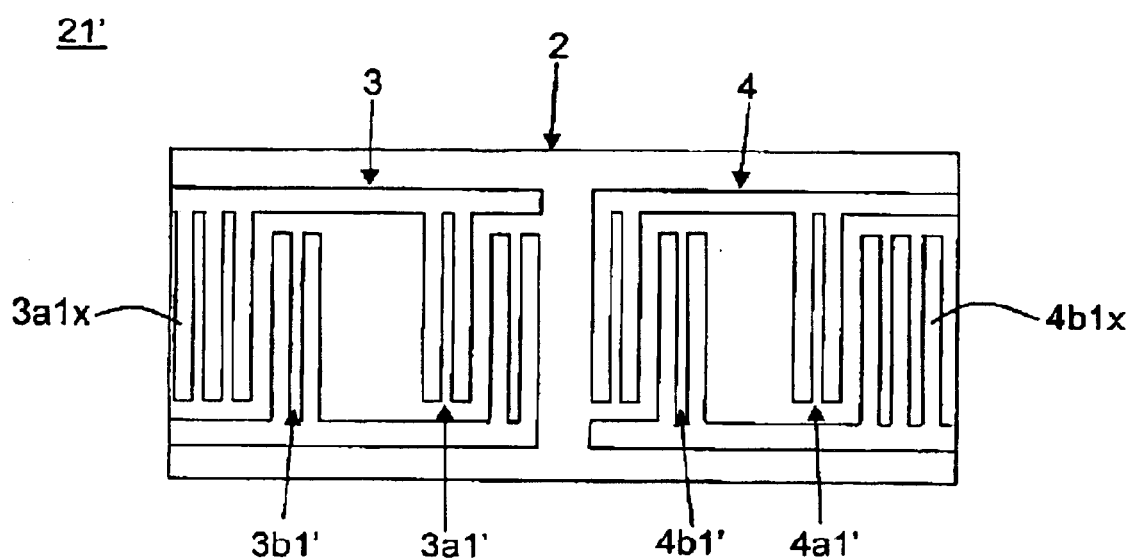
FIG. 13 is a plan view showing a modification of an edge-reflection surface acoustic wave filter according to a third preferred embodiment of the present invention.

FIG. 13 shows a modification of the third preferred embodiment of the present invention. The edge-reflection surface acoustic wave filter 21' uses split electrodes $3a1'$, $3b1'$, $4a1'$, and $4b1'$ instead of the electrode fingers $3a1$, $3b1$, $4a1$, and $4b1$ shown in FIG. 4.

In the first to the third preferred embodiments, the outermost electrode fingers respectively on the sides of the edges $2a$ and $2b$ are removed, constructed as floating electrode fingers, or connected to the same potential as adjacent electrode fingers by a "withdrawal" process. However, such arrangement may be applied only on the side of one of the reflection edges of an edge-reflection surface acoustic wave filter.

In the first to the third preferred embodiments, the outermost electrode finger in the direction of propagation of surface acoustic waves is 1) removed, 2) constructed as a floating electrode finger, or 3) connected to the same potential as an adjacent electrode finger. However, such arrangement may be applied to two or more outermost electrode fingers in the direction of propagation of surface acoustic waves.

Figure 5:
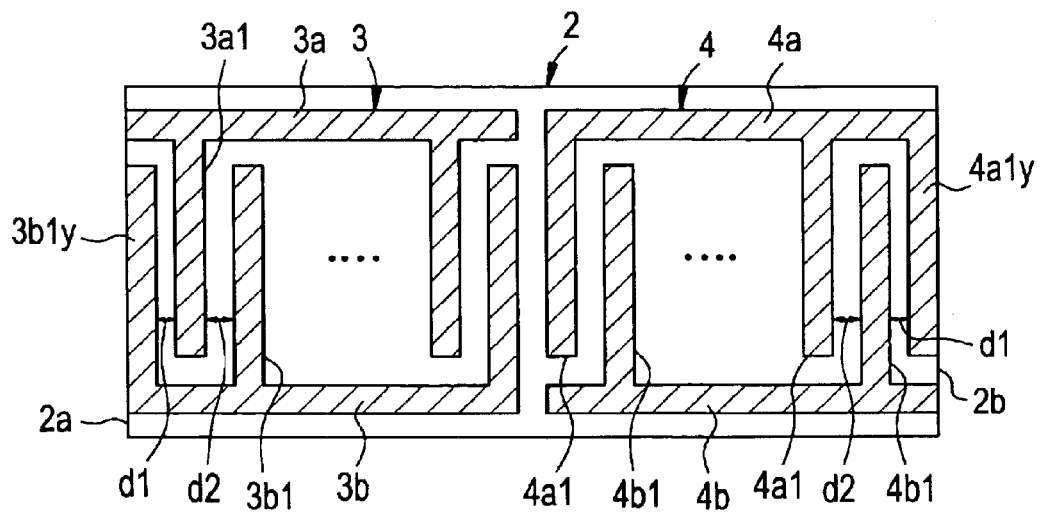
FIG. 5 is a plan view of an edge-reflection surface acoustic wave filter according to a fourth preferred embodiment of the present invention.

FIG. 5 is a plan view of an edge-reflection surface acoustic wave filter according to a fourth preferred embodiment of the present invention. The construction of the edge-reflection surface acoustic wave filter is preferably substantially the same as the first preferred embodiment except in that the width of the outermost electrode fingers $3b_{1y}$ and $4a_{1y}$ in the direction of propagation of surface acoustic waves respectively on the sides of the edges $2a$ and $2b$ is greater and in that the distance d1 between the outermost electrode fingers $3b_{1y}$ and $4a_{1y}$ and adjacent electrode fingers is less than the distance d2 between other electrode fingers.

According to the fourth preferred embodiment, in which the width of the outermost electrode fingers in the direction of propagation of surface acoustic waves respectively on the sides of the edges $2a$ and $2b$ is greater, similarly to the first preferred embodiment, desired filter characteristics can be achieved without causing variations in filter characteristics. More specifically, because the outermost electrode fingers in the direction of propagation of surface acoustic waves are greater, the electrode fingers are more unsusceptible to damage in the process of cutting a mother piezoelectric substrate to form the edges $2a$ and $2b$, thus eliminating variations in filter characteristics.

Furthermore, in this preferred embodiment as well, similarly to the first and the second preferred embodiments, the positions of the edges $2a$ and $2b$ are determined in accordance with desired filter characteristics. Thus, filter characteristics such as bandwidth remain substantially unaltered.

Figure 6:
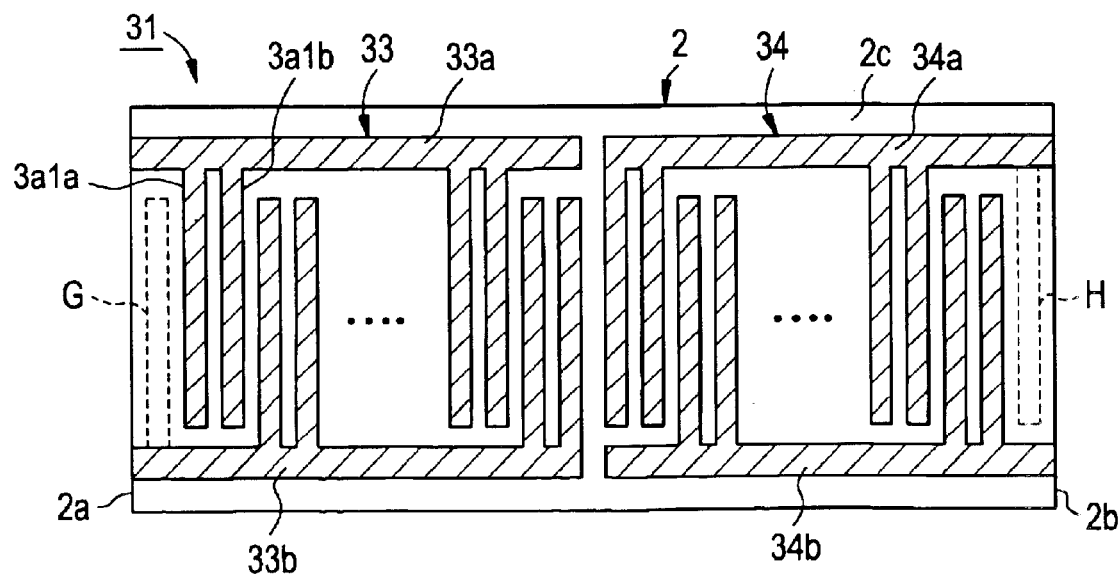
FIG. 6 is a plan view showing a modification of the edge-reflection surface acoustic wave filter according to the first preferred embodiment of the present invention.

In the first to the fourth preferred embodiments, the IDTs 3 and 4 preferably include so-called single electrodes. However, the IDTs 3 and 4 may include so-called split electrodes. FIG. 6 is a plan view showing a modification of the first preferred embodiment, i.e., an edge-reflection surface acoustic wave filter incorporating IDTs that include split electrodes.

In the edge-reflection surface acoustic wave filter 31, IDTs 33 and 34 are disposed on a piezoelectric substrate 2. The IDTs 33 and 34 have a pair of comb electrodes 33a and 33b and a pair of comb electrodes 34a and 34b, respectively. In the comb electrodes 33a to 34b, each electrode finger in the first preferred embodiment is split into two electrode segments. For example, as shown in FIG. 6, the electrode finger $3a_1$ in FIG. 1 is split into two electrode segments $3a_{1a}$ and $3a_{1b}$. Such an electrode finger having a plurality of electrode segments is referred to as a split electrode. According to the present invention, the IDTs may include split electrodes.

In the edge-reflection surface acoustic wave filter 31 shown in FIG. 6, similarly to the first preferred embodiment, the outermost electrode finger on each side is removed, as indicated by dashed lines G and H.

Figure 8:
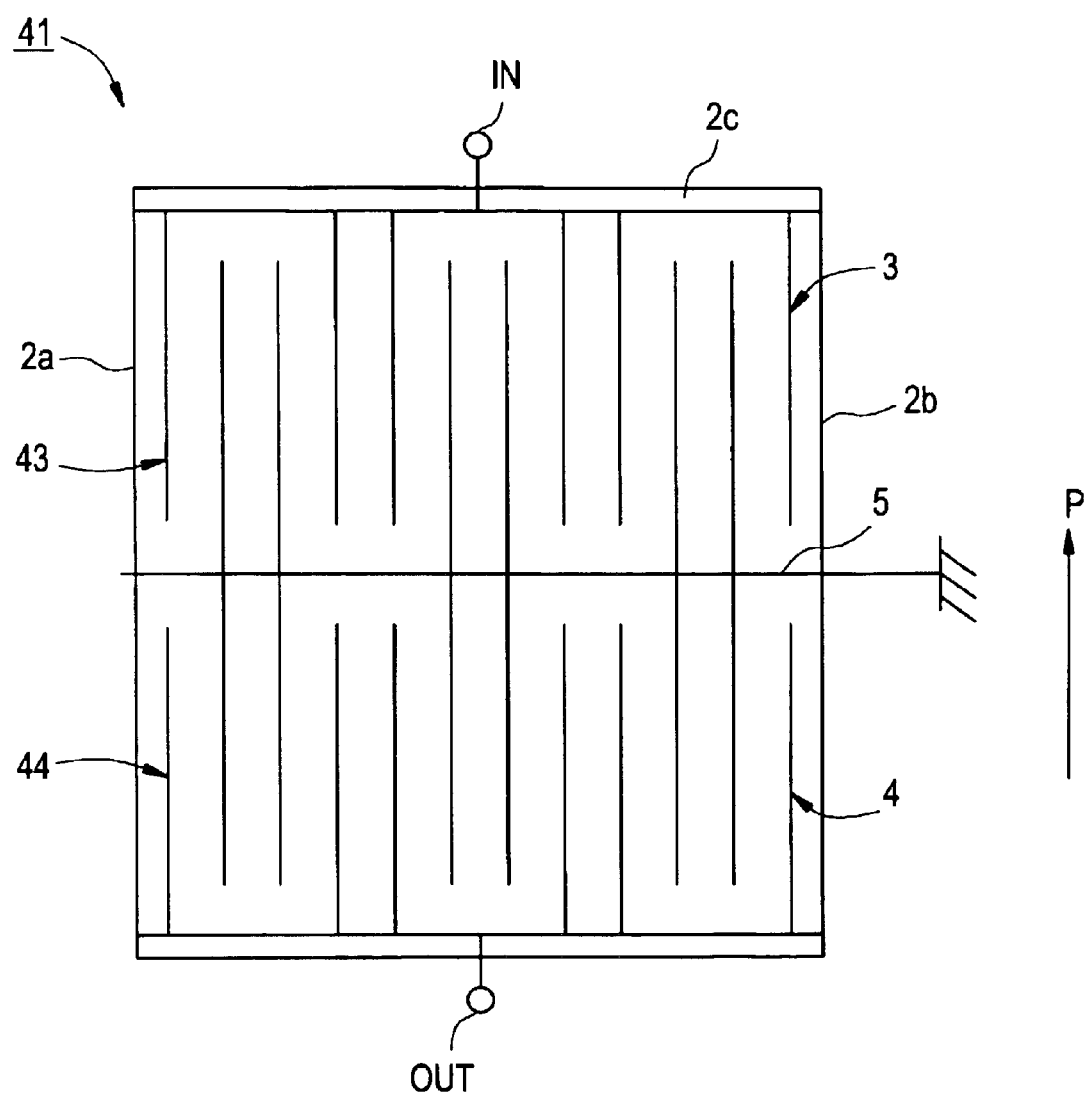
FIG. 8 is a schematic plan view showing the electrode structure of a transversely coupled resonator filter to which the present invention is applied.
Figure 9:
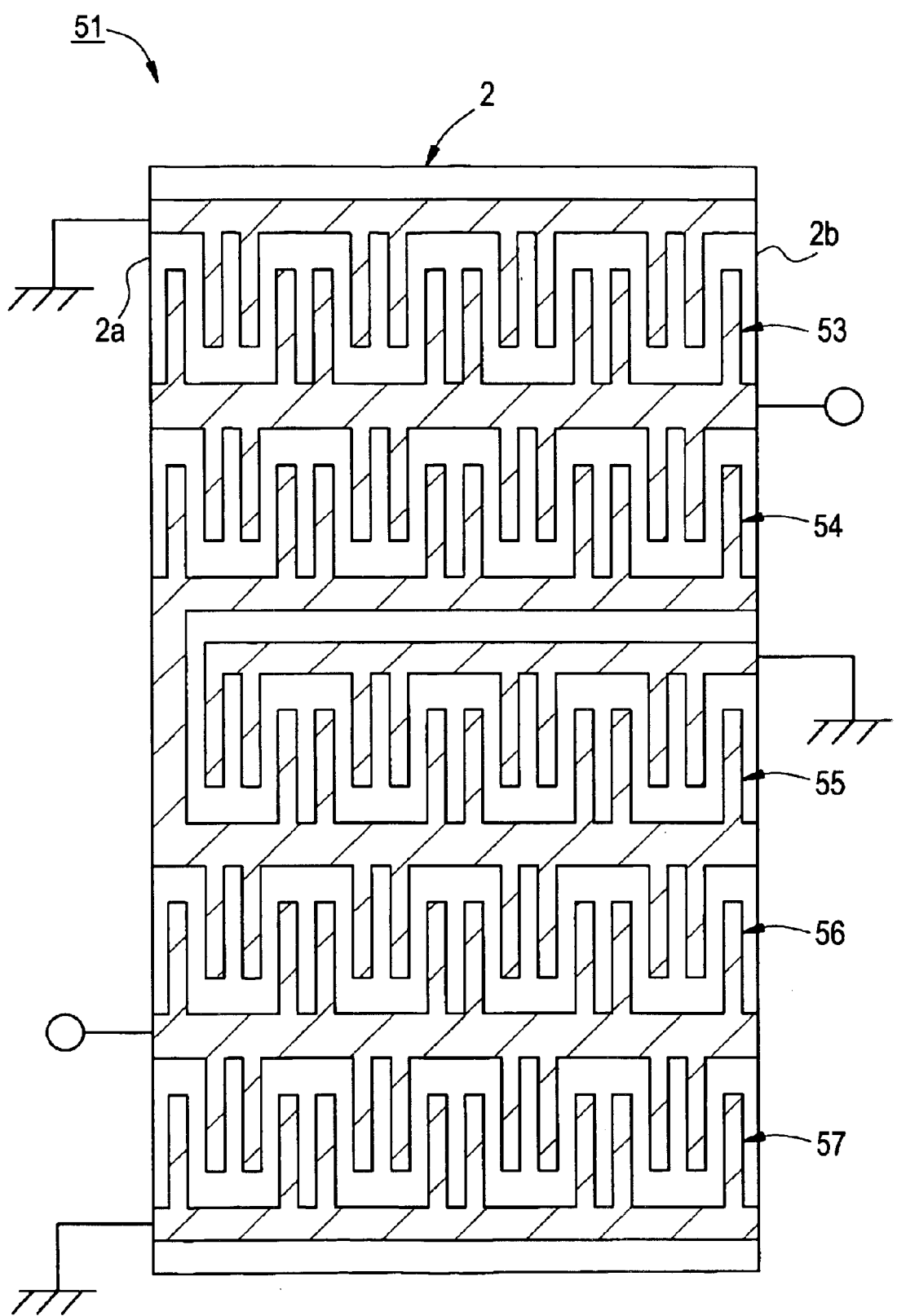
FIG. 9 is a schematic plan view of a ladder filter to which the present invention is applied.

In the first to the fourth preferred embodiments and the modification, the present invention is applied to longitudinally coupled resonator filters in which a plurality of IDTs is disposed on a piezoelectric substrate along the direction of propagation of surface acoustic waves. However, the present invention may also be applied to edge-reflection surface acoustic wave filters having different structures. FIGS. 8 and 9 show other examples of edge-reflection surface acoustic wave filter to which the present invention is applied.

FIG. 8 is a schematic plan view showing the electrode structure of a transversely coupled resonator filter 41, in which a first and a second IDTs 43 and 44 are arranged in a direction that is substantially perpendicular to the direction of propagation of surface acoustic waves. FIG. 9 is a schematic plan view showing the electrode structure of a ladder filter 51.

In the transversely coupled resonator filter 41 shown in FIG. 8 and the ladder filter 51 shown in FIG. 9, by using constructions similar to the first to the third preferred embodiments on the side of at least one of the reflection edges, similarly to the first to the third preferred embodiments, desired filter characteristics such as bandwidth can be achieved without causing variation in filter characteristics.

Next, the construction of a duplexer including an edge-reflection surface acoustic wave filter according to the present invention will be described with reference to FIG. 10.

Figure 10:
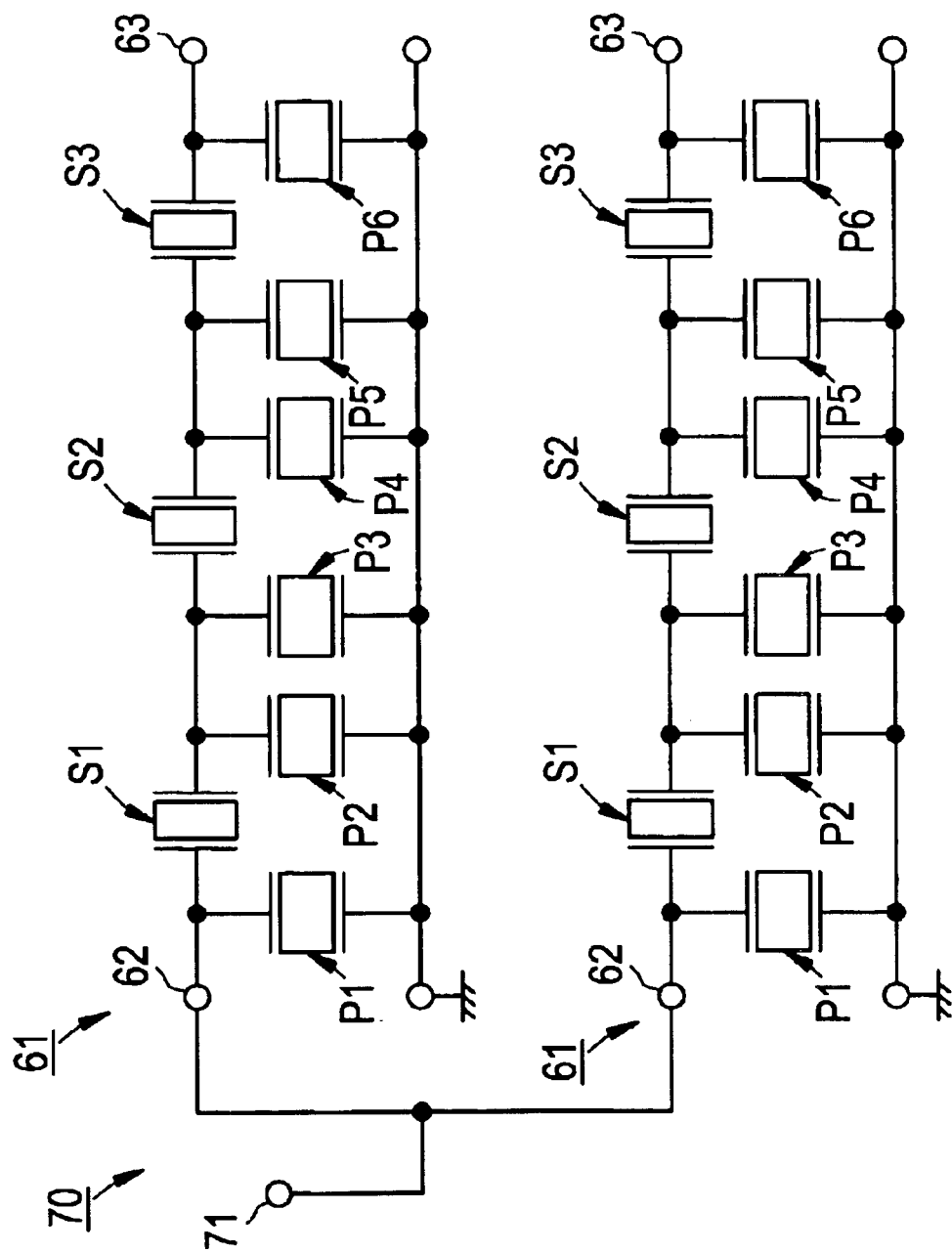
FIG. 10 is a schematic plan view of a duplexer according to a preferred embodiment of the present invention.

FIG. 10 is a circuit diagram of the duplexer according to the present preferred embodiment. The duplexer 70 according to the present preferred embodiment includes a pair of edge-reflection surface acoustic wave filters according to other preferred embodiments of the present invention described above. More specifically, input terminals 62 and 62 of the ladder filters 61 and 61 are commonly connected to define a first port 71. Output terminals 63 and 63 of the ladder filters 61 and 61 are used individually, respectively defining second and third ports of the duplexer 70.

As described above, the duplexer 70 can be implemented by incorporating the pair of ladder filters 61 and 61.

Figure 11:
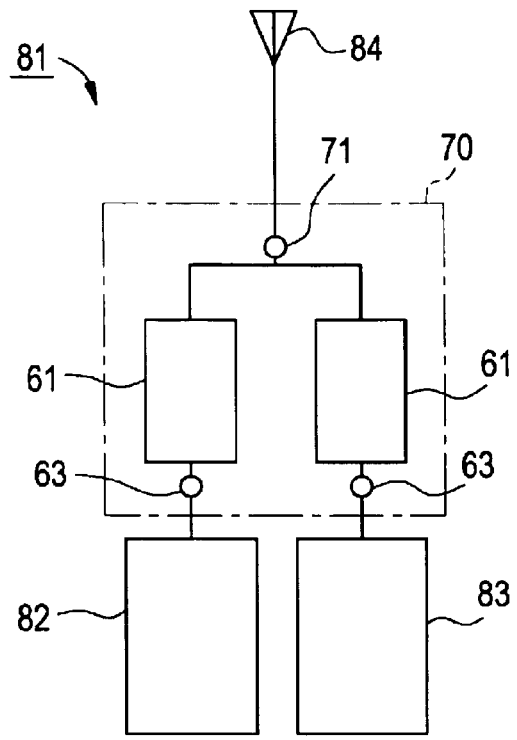
FIG. 11 is a schematic construction diagram of a communications apparatus according to another preferred embodiment of the present invention.

Furthermore, a communications apparatus can be implemented by incorporating the duplexer 70, an example of which is shown in FIG. 11.

The communications apparatus 81 according to the present preferred embodiment includes the duplexer 70, a transmission circuit 82, and a reception circuit 83. The first port 71 of the duplexer 70 is connected to an antenna 84, and the output terminals 63 and 63 defining second and third ports are connected to the transmission circuit 82 and the reception circuit 83, respectively.

In the duplexer 70, the pair of ladder filters 61 is constructed so as to have different passbands, so that the antenna 84 can be used as a transmitting antenna and a receiving antenna.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An edge-reflection surface acoustic wave filter using Shear Horizontal type surface acoustic waves comprising:
   a piezoelectric substrate having a first edge and a second edge disposed opposite to each other, said first and second edges defining reflection edges; and
   at least two interdigital transducers including electrode fingers and being disposed on said piezoelectric substrate;
   wherein distances between an inner side of an outermost electrode finger and the first and second edges are greater than a distance between the outermost electrode finger and an adjacent electrode finger.

2. An edge-reflection surface acoustic wave filter according to claim 1, wherein the electrode fingers of said at least two interdigital transducers include split electrodes.

3. An edge-reflection surface acoustic wave filter according to claim 1, wherein the filter is a longitudinally coupled resonator filter.

4. An edge-reflection surface acoustic wave filter according to claim 1, wherein the filter is a transversally coupled resonator filter.

5. An edge-reflection surface acoustic wave filter according to claim 1, wherein the filter is a ladder filter.

6. A duplexer comprising an edge-reflection surface acoustic wave filter according to claim 1.

7. A communications apparatus comprising a duplexer according to claim 6.

8. An edge-reflection surface acoustic wave filter using Shear Horizontal type surface acoustic waves comprising:
   a piezoelectric substrate having a first edge and a second edge disposed opposite to each other, said first and second edges defining reflection edges; and
   at least two interdigital transducers including electrode fingers and being disposed on said piezoelectric substrate;
   wherein at least one of the electrode fingers located at an outermost position in the direction of propagation of the surface acoustic waves on the side of at least one of the reflection edges is a floating electrode finger that is not electrically connected to any of the other electrode fingers.

9. An edge-reflection surface acoustic wave filter according to claim 8, wherein the electrode fingers of said at least two interdigital transducers include split electrodes.

10. An edge-reflection surface acoustic wave filter according to claim 8, wherein the filter is a longitudinally coupled resonator filter.

11. An edge-reflection surface acoustic wave filter according to claim 8, wherein the filter is a transversally coupled resonator filter.

12. An edge-reflection surface acoustic wave filter according to claim 8, wherein the filter is a ladder filter.

13. A duplexer comprising an edge-reflection surface acoustic wave filter according to claim 8.

14. A communications apparatus comprising a duplexer according to claim 13.

15. An edge-reflection surface acoustic wave filter using Shear Horizontal type surface acoustic waves comprising:
   a piezoelectric substrate having a first edge and a second edge disposed opposite to each other, said first and second edges defining reflection edges; and
   at least two interdigital transducers including electrode fingers and being disposed on said piezoelectric substrate; wherein
   the electrode finders of the at least two interdigital transducers include split electrodes; and
   at least one of the electrode fingers located at an outermost position in the direction of propagation of the surface acoustic waves is connected to the same potential as an adjacent split electrode.

16. An edge-reflection surface acoustic wave filter according to claim 15, wherein the filter is a longitudinally coupled resonator filter.

17. An edge-reflection surface acoustic wave filter according to claim 15, wherein the filter is a transversally coupled resonator filter.

18. An edge-reflection surface acoustic wave filter according to claim 15, wherein the filter is a ladder filter.

19. A duplexer comprising an edge-reflection surface acoustic wave filter according to claim 15.

20. A communications apparatus comprising a duplexer according to claim 19.

21. An edge-reflection surface acoustic wave filter using Shear Horizontal type surface acoustic waves comprising:
   a piezoelectric substrate having a first edge and a second edge disposed opposite to each other, said first and second edges defining reflection edges; and
   at least two interdigital transducers including electrode fingers and being disposed on said piezoelectric substrate;
   wherein the width of at least one of the electrode fingers located at an outermost position in the direction of propagation of the surface acoustic waves on the side of at least one of the reflection edges is arranged such that the distance between the at least one of the electrode fingers located at an outermost position and one of the electrode fingers that is adjacent thereto is shorter than the distance between other electrode fingers in the interdigital transducer to which the at least one of the electrode fingers located at an outermost position belongs.

22. An edge-reflection surface acoustic wave filter according to claim 21, wherein the electrode fingers of said at least two interdigital transducers include split electrodes.

23. An edge-reflection surface acoustic wave filter according to claim 21, wherein the filter is a longitudinally coupled resonator filter.

24. An edge-reflection surface acoustic wave filter according to claim 21, wherein the filter is a transversally coupled resonator filter.

25. An edge-reflection surface acoustic wave filter according to claim 21, wherein the filter is a ladder filter.

26. A duplexer comprising an edge-reflection surface acoustic wave filter according to claim 21.

27. A communications apparatus comprising a duplexer according to claim 26.

28. An edge-reflection surface acoustic wave filter using Shear Horizontal type surface acoustic waves comprising:
   a piezoelectric substrate having a first edge and a second edge disposed opposite to each other, said first and second edges defining reflection edges; and
   at least two interdigital transducers including electrode fingers and being disposed on said piezoelectric substrate; wherein
   the electrode fingers of the at least two interdigital transducers include split electrodes; and
   distances between an inner side of an outer split electrode of an outermost electrode finger and the first and second edges are greater than a distance between an inner split electrode of the outermost electrode finger and an adjacent electrode finger.

29. An edge-reflection surface acoustic wave filter according to claim 28, wherein the filter is a longitudinally coupled resonator filter.

30. An edge-reflection surface acoustic wave filter according to claim 28, wherein the filter is a transversally coupled resonator filter.

31. An edge-reflection surface acoustic wave filter according to claim 28, wherein the filter is a ladder filter.

32. A duplexer comprising an edge-reflection surface acoustic wave filter according to claim 28.

33. A communications apparatus comprising a duplexer according to claim 32.

* * * * *